US007142997B1

(12) United States Patent
Widner

(10) Patent No.: US 7,142,997 B1
(45) Date of Patent: Nov. 28, 2006

(54) AUTOMATIC POWER FACTOR CORRECTOR

(75) Inventor: Edward D. Widner, Austin, CO (US)

(73) Assignee: Tripac Systems, Inc., Salt Lake City, UT (US)

( * ) Notice: Subject to any disclaimer, the term of this patent is extended or adjusted under 35 U.S.C. 154(b) by 71 days.

(21) Appl. No.: 11/007,781

(22) Filed: Dec. 8, 2004

(51) Int. Cl.
*G01R 13/02* (2006.01)

(52) U.S. Cl. ........................................ 702/67; 323/235

(58) Field of Classification Search .................. 702/67; 323/235, 210, 211, 207; 324/126; 318/18; 315/247, 209 R; 363/89, 17, 126, 18, 16, 363/44; 345/212
See application file for complete search history.

(56) References Cited

U.S. PATENT DOCUMENTS 3,913,002 A * 10/1975 Steigerwald et al. .......... 363/18
4,356,440 A 10/1982 Curtiss et al. .............. 323/210
4,417,194 A 11/1983 Curtiss et al. ................ 322/47
4,493,040 A 1/1985 Vanderhelst ................ 364/477
5,134,356 A 7/1992 El-Sharkawi et al. ....... 323/211
5,180,963 A 1/1993 El-Sharkawi et al. ....... 323/211
5,473,244 A 12/1995 Libove et al. .............. 324/126
2004/0032230 A1* 2/2004 Schwarz et al. ............ 318/254
2005/0184708 A1* 8/2005 Pippin et al. .............. 323/235

* cited by examiner

*Primary Examiner*—John Barlow
*Assistant Examiner*—Xiuqin Sun
(74) *Attorney, Agent, or Firm*—Kirton & McConkie; Michael F. Krieger

(57) ABSTRACT

A computer controlled solid-state switching power factor corrector, which senses the phase angle of each phase of the current as well as the voltage and automatically aligns the current phase angle to the voltage phase angle. This power factor correction is designed to update at the frequency of the power line and to provide a large number of discrete steps of correction.

19 Claims, 2 Drawing Sheets

AUTOMATIC POWER FACTOR CORRECTOR

BACKGROUND OF INVENTION

1. Field of the Invention

This invention relates to power factor correction. More specifically, this invention relates to computer controlled solid-state switching power factor correction.

2. Description of Related Art

A variety of techniques for power factor correction have been proposed and are well known in the art. Generally, these prior systems and techniques sense only one phase and switch, using contactor relays, all three phases at one time.

Although, the following may not necessarily be "prior art", the reader is referred to the following U.S. patent documents for general background material. Each of these patent documents is hereby incorporated by reference in its entirety for the material contained therein.

U.S. Pat. No. 4,356,440 describes a discrete-time, closed loop power factor corrector system that control the coupling of a delta-connected switched capacitor array to a 3- or 4-wire power line which may have time-varying, unbalanced, inductive loads.

U.S. Pat. No. 4,417,194 describes an electric power generator system that includes a switched capacitor controlled induction generator adapted to provide power at a regulated voltage and frequency.

U.S. Pat. No. 4,493,040 describes a computer-controlled welding apparatus that includes a phase-controlled resistance welding circuit for selectively conducting pulses of a welding current to a workpiece and a control circuit for controlling the conduction of the welding circuit.

U.S. Pat. No. 5,134,356 describes a system and method for determining and providing reactive power compensation for an inductive load.

U.S. Pat. No. 5,180,963 describes an optically triggered solid-state switch and method for switching a high voltage electrical current.

U.S. Pat. No. 5,473,244 describes an apparatus for performing non-contacting measurements of the voltage, current and power levels of conductive elements such as wires, cables and the like, that includes an arrangement of capacitive sensors for generating a first current in response to variation in voltage of a conductive element.

SUMMARY OF INVENTION

It is desirable to provide a method and system for automatically correcting the power factor in an electrical power system. It is particularly desirable to provide such a method and system, which saves electrical energy by using solid state switching to eliminate current inrush and eliminating the need for the reactors required to handle such current in-rush. It is also desirable to provide frequent power factor correction to the desired levels in a system that is automatic once installed.

Accordingly, it is an object of an embodiment of this invention to provide computer controlled solid-state switching power factor correction.

It is another object of an embodiment of this invention to provide power factor correction using solid state switches that switch at or about the zero crossing point.

It is a further object of an embodiment of this invention to provide power factor correction that senses the phase angle of the current and adds or removes capacitors as needed on each phase individually.

It is a still further object of an embodiment of this invention to provide power factor correction that switches multiple times per second and that uses multiple steps of correction.

Another object of an embodiment of this invention is to provide power factor correction that minimizes current in-rush, thereby eliminating the required reactors associated with this inrush of current.

A further object of an embodiment of this invention is to provide power factor correction that is automatic.

A still further object of an embodiment of this invention is to provide power factor correction that senses multiple phases.

Additional objects, advantages and other novel features of this invention will be set forth in part in the description that follows and in part will become apparent to those skilled in the art upon examination of the following or may be learned with the practice of the invention. The objects and advantages of this invention may be realized and attained by means of the instrumentalities and combinations particularly pointed out in the appended claims. Still other objects of the present invention will become readily apparent to those skilled in the art from the following description wherein there is shown and described the preferred embodiment of this invention, simply by way of illustration of one of the modes best suited to carry out this invention. As it will be realized, this invention is capable of other different embodiments, and its several details, specific circuits and method steps are capable of modification without departing from the invention. Accordingly, the objects, drawings and descriptions should be regarded as illustrative in nature and not as restrictive.

BRIEF DESCRIPTION OF DRAWINGS

The accompanying drawings incorporated in and forming a part of the specification, illustrate a preferred embodiment of the present invention. Some, although not all, alternative embodiments are described in the following description.

In the drawings.

Reference will now be made in detail to the present preferred embodiment of the invention, an example of which is illustrated in the accompanying drawings.

DETAILED DESCRIPTION

Power factor correction is used to align phase angles of the voltage and current in an A/C power system. Power factor correction is important in maximizing the energy efficiency of a power system. Typically power factor correction has been accomplished by storing unused current in capacitor(s) until the next cycle. The use of fixed capacitors in power factor correction has been demonstrated to have significant limitations in any system without constant loads. Adjustable capacitance power correction has been attempted, but prior systems have also had significant drawbacks. For example, prior systems sense only one phase of a three phase electrical system and then "correct" all phases based only on the information from the single phase. Also, prior systems have typically used electro-magnetic relays, which have a tendency to create power spikes. Electromagnetic relays also tend to be susceptible to contact point wear and damage that leads to undesirable heat, resistance and distortion. In sum, electro-magnetic relays are not appropriate for use in switching capacitors.

This present invention uses computerized electronic switching technology to provide long lasting, low to no maintenance, user-friendly, full-time power factor correction. This invention can work with 690, 480, 308, 240 and 208 Volt three-phase power systems, Wye or Delta configurations and both 50 Hz and 60 Hz. Power factor correction from zero to maximum rating can be accomplished. This present invention is designed to sense the phase angle on all three phases individually and applies to each phase single voltage phase to current phase correction. The present embodiment of this invention can incrementally adjust by as little as 0.17 kVAr, in as many as 256 incremental steps per phase. The number of incremental steps and amount of adjustment can be increased or decreased in alternative embodiments of this invention. This invention minimizes switching transients and provides true or near-true zero crossing through the use of computerized electronic technology.

Figure 1:
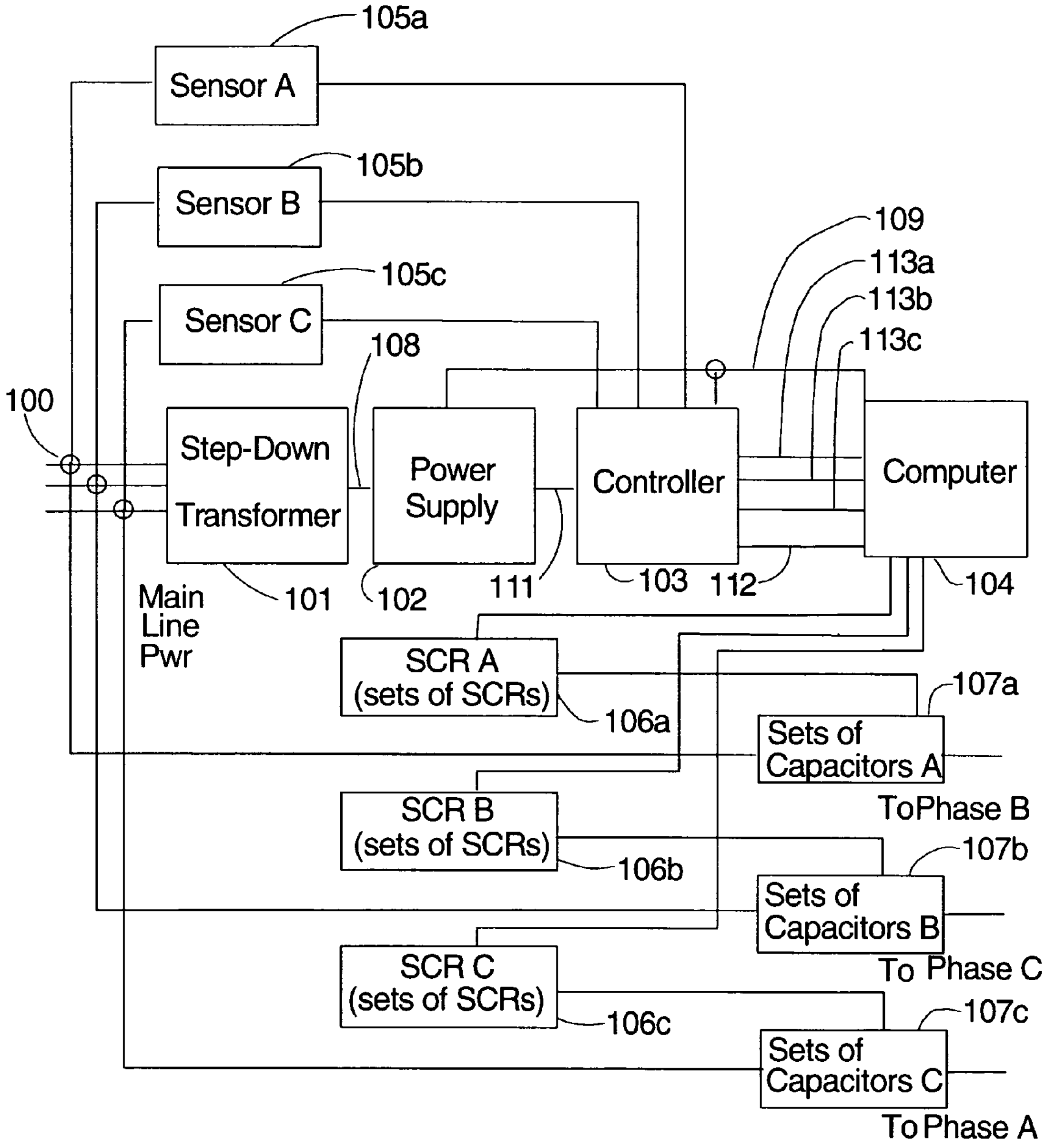
FIG. 1 is a system block diagram showing the major sections of the present embodiment of the invention.

FIG. 1 shows a system block diagram showing the major sections of the present embodiment of the invention. In this embodiment, three-phase main line power 100 is connected to a step-down transformer 101. The three-phase main line power 100 can be in either a delta or Wye configuration. The step-down transformer 101 provides 120 VAC power 108. The 120 VAC power 108 is provided to a power supply 102. The power supply 102, in the present embodiment, provides 5 VDC power 109 to power the controller 103 and the computer or processor 104. A current sensor 105*a*, 105*b*, 105*c* is connected to a phase of the three-phase main line power 100, with each phase having a current sensor 105*a,b,c* connected thereto. The current sensors 105*a,b,c* identify the phase of the current signal being measured on each phase of the three-phase main line power 100. Each current sensor 105*a,b,c* provides a current signal 110*a,b,c* to the controller 103. A voltage signal 111 is sent from the power supply 102 to the controller 103. This voltage signal 111 contains the AC phase information of the voltage from the main line power 100. The controller 103 processes the received voltage signal 111 and the received current phase signals 110*a,b,c* and produces a square wave voltage signal 112 and a square wave current signal 113*a,b,c* for each phase of the main line power 100. In this present embodiment these signals 112, 113*a,b,c* are square waves, although in alternative envisioned embodiments these signals may be other detectable wave forms, including but not limited to saw-tooth waves, triangular waves, sinusoidal waves and the like. These signals 112, 113*a,b,c* are provided by the controller 103 to the computer 104 for processing. The computer 104 processes and compares the phase angle of the signals 12, 113*a,b,c*. The computer 104 identifies if the phase angle of each current component lags or leads the phase angle of the voltage. Once the phase angle lead or lag, for each of the main line power phases 100 is identified by the computer 104, the computer 104 commands banks of switches SCR A 106*a*, SCR B 106*b* and SCR C 106*c* to switch in or out one or more sets of capacitors 107*a*, 107*b*, 107*c*. In the present embodiment of this invention, each SCR 106*a,b,c* is includes eight sets of one or more SCRs, thereby, capable of switching on or off up to eight different sets of capacitors for each phase A, B and C. Also, in the present embodiment, each switch SCR A 106*a*, SCR B 106*b*, SCR C 106*c* is connected to a bank of eight capacitors or sets of capacitors 107*a,b,c*. Each bank of capacitors 107*a,b,c* is presently composed of capacitors of varying capacitance of increasing values of capacitance. For example, a typical bank of capacitors 107*a,b,c* would include a set of capacitors having a relatively small capacitance, a second set having a value of capacitance double that of the first set, a third set having a value of capacitance double that of the second set, and so on through the eight sets of capacitors. In this manner there are up to 256 different combinations or steps of capacitance that can be selected for each phase of the main line power 100. The banks of capacitance 107*a,b,c* each receive a single phase of the main line power 100 and provide three-phase power where the phase angle of the current is aligned with the phase angle of the voltage. Accordingly, this invention minimizes the loss of electrical energy cause by phase differences between the voltage signal and the current signals. Typical AC power operates at 50 Hz or 60 Hz, therefore in the present embodiment of this invention corrections are made by computer 104 commands to the switches 106*a,b,c* to the banks of capacitors 107*a,b,c*, thereby correcting the phase angles of the current and voltage signals at least once per cycle or 50 or 60 times per second. In alternative embodiments, the corrections to the phase angles of the power phases can be done more frequently or less frequently and required to bring the power into efficient alignment. The sensors 105*a,b,c* are adapted to sense and characterize the current components of the three-phase main line power 100. Typically, this includes sensing the current phase angle. The controller 103 converts the sensor signals to a waveform, which can be processed and compared by the computer 104. The computer 104 performs the phase angle comparison and controls the selection of capacitance for each phase of three-phase power 100. As noted above, the switches 106*a,b,c* receive the control signal from the computer 104 and turn on or off as desired the sets of capacitors 107*a,b,c* in order to effect a phase angle shift of the current to thereby align the current with the voltage.

Figure 2:
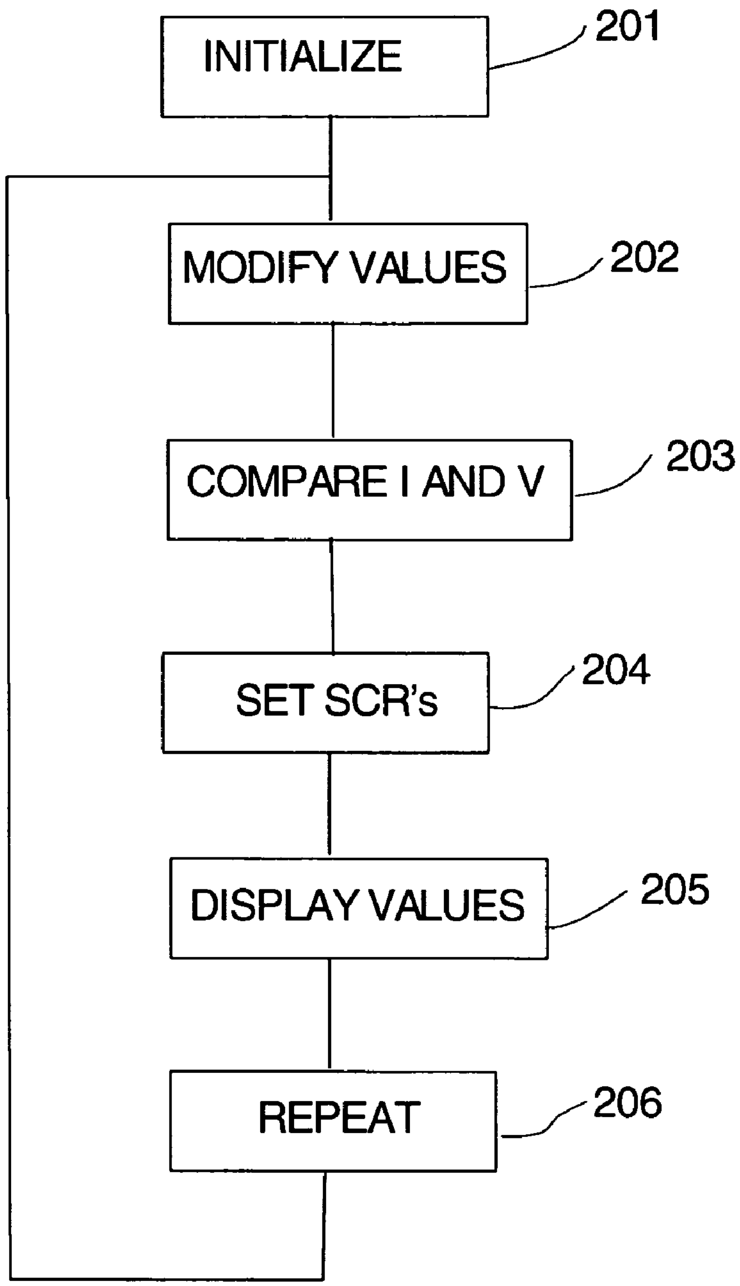
FIG. 2 is a top-level flow chart of the power factor control method of the present embodiment of the invention.

FIG. 2 shows a top-level flow chart of the power factor control method of the present embodiment of the invention. The present embodiment of the method of comparing current and voltage phase angles is performed in a programmable computer device 104. The typical such computer 104 includes a processor; dynamic and static memory; a long term storage device, such as a magnetic disc drive; an input device, such as a keyboard and/or mouse; a display device, such as a CRT or flat panel display; and an output device, such as a printer or the like. Although, in alternative embodiments, the computer could be a stand-alone processing unit without dedicated input, display or output devices. Also, it is likely that the computer device used in this invention would be provided with a network interface for communicating with other computational devices, over a dedicated line, a telephone line, a wireless RF link or the like. The present method has been coded in the Pascal programming language, and has been compiled to be executed on a standard personal computer. Alternative embodiments of this method may be written in alternative languages or assembly or machine code and can be executed on special purpose computational devices, without departing from the concept of this invention. The method typically, but not exclusively, begins with variable and parameter initialization 201. The user can then be given an opportunity to modify 202 the values and trigger points for the comparison between the received phase angles of the current and that of the voltage. A comparison 203 between the phase angle of each current with the phase angle of the voltage is made. If the comparison results in a difference that exceeds the parameter triggers or thresholds set during initialization 201 or during modification 202, the SCRs are set 204 to switch either on or off the appropriate sets of capacitors. This comparison 203 step includes receiving the current and voltage phase angles, computing the difference between the current and voltage phase angles and producing a value for the amount of difference between the current and voltage phase angles. The value of difference is compared against the values and/or trigger points initialized in step 201 or modified in step 202. Values, including the phase angles and other measures of the current and voltage as well as the variables and parameters, including trigger points, can then be displayed 205 for the user. The process, being continuous, repeats 206 by returning to the modify values step 202 where the user is provided an opportunity to modify the values. In some alternative configurations, during operation the modify values step 202 and the display values step 205 would not be performed. These steps 202 and 205 would, in these alternative embodiments, only be performed during diagnostics or system administrator maintenance.

The foregoing description of the present embodiment of this invention has been presented for the purposes of illustration and description of the best mode of the invention currently known to the inventor. It is not intended to be exhaustive or to limit the invention to the precise form disclosed. Obvious modifications or variations are possible and foreseeable in light of the above teachings. This embodiment of the invention was chosen and described to provide the best illustration of the principles of the invention and its practical application to thereby enable one of ordinary skill in the art to make and use the invention in various embodiments and with various modifications as are suited to the particular use contemplated. All such modifications and variations which are within the scope of the appended claims, when then are interpreted in accordance with the breadth to which they are fairly, legally and equitably entitled, should be considered within the scope of this invention.

The invention claimed is:

1. A system for power factor correction, comprising:

(A) a first sensor receiving an AC power line and producing a sensor output;

(B) a controller receiving said sensor output and producing a current component waveform representing the phase angle of a current component and a voltage component waveform representing the phase angle of a voltage component;

(C) a computer receiving said current component waveform and said voltage component waveform, said computer comparing said current component waveform and said voltage component waveform and producing a first control signal corresponding to a selection of one or more sets of capacitors to be switched so as to receive said AC power line and to output an AC output power signal to a load wherein the phase angle of the voltage is generally aligned with the phase angle of the current;

(D) a first switch receiving said control signal from said computer and producing a first set of one or more selection signals corresponding to said selection of said one or more sets of capacitors to be switched so as to receive said AC power line and to output said AC output power signal; and (E) a first bank of said one or more sets of capacitors, receiving said AC power line and said first set of one or more selection signals and producing said AC output power signal wherein the phase angle of the voltage is generally aligned with the phase angle of the current.

2. A system for power factor correction, as recited in claim 1, wherein said computer produces said control signal at a rate not less than the frequency of said received AC power line.

3. A system for power factor correction, as recited in claim 1, wherein said switch further comprises a group of eight switches each producing a selection signal.

4. A system for power factor correction, as recited in claim 1, wherein said bank of one or more sets of capacitors, further comprises eight sets of capacitors.

5. A system for power factor correction, as recited in claim 4, wherein said eight sets of capacitors each have different capacitance values.

6. A system for power factor correction, as recited in claim 1, wherein said computer further comprises a digital processor.

7. A system for power factor correction, as recited in claim 1, further comprising a second sensor receiving a second phase of said AC power line.

8. A system for power factor correction, as recited in claim 7, further comprising a third sensor receiving a third phase of said AC power line.

9. A system for power factor correction, as recited in claim 7, further comprising a second switch receiving a second control signal from said computer and producing a second set of one or more selection signals.

10. A system for power factor correction, as recited in claim 9, further comprising a second bank of capacitors receiving said second phase of said AC power line and said second set of one or more selection signals wherein said first bank of capacitors has a capacitance, wherein said second bank of capacitors has a capacitance, and wherein the capacitance of the first bank of capacitors and the capacitance of the second bank of capacitors need not be equal.

11. A system for power factor correction, as recited in claim 9, further comprising a third switch receiving a third control signal from said computer and producing a third set of one or more selection signals.

12. A system for power factor correction, as recited in claim 11, further comprising a third bank of capacitors receiving said third phase of said AC power line and said third set of one or more selection signals, wherein the third bank of capacitors has a capacitance that needs not be equal to the capacitance of either the first bank of capacitors or the second bank of capacitors.

13. A system for power factor correction, as recited in claim 1, further comprising a step-down transformer receiving said AC power line and producing a standard 120 VAC power line.

14. A system for power factor correction, as recited in claim 13, further comprising a power supply receiving said 120 VAC power line and producing a power signal appropriate for powering said controller and said computer.

15. A system for power factor correction, as recited in claim 1, wherein said computer further comprises a program for comparing current and voltage phase angles.

16. A system for power factor correction, as recited in claim 15, wherein said program further comprises a method comprising:

(1) initializing data values;

(2) receiving current phase angle information;

(3) receiving voltage phase angle information;

(4) comparing said current phase angle information with said voltage phase angle information;

(5) determining if said comparison of said current phase angle information and said voltage phase angle information exceeds a threshold; and (6) setting a switch based on said determination, said switch electrically connecting or disconnecting one or more capacitors to an AC power line.

17. A system for power factor correction, as recited in claim 16, wherein said method further comprises modifying said data values.

18. A system for power factor correction, as recited in claim 16, wherein said method further comprises displaying information to a user.

19. A system for power factor correction, as recited in claim 16, wherein said method further comprises repeating said receiving current phase angle information, said receiving said voltage phase angle information and comparing steps.

* * * * *